(12) United States Patent
Mohan et al.

(10) Patent No.: US 9,632,150 B2
(45) Date of Patent: Apr. 25, 2017

(54) MAGNETIC FIELD SENSOR WITH INCREASED FIELD RANGE

(71) Applicant: EVERSPIN TECHNOLOGIES, INC., Chandler, AZ (US)

(72) Inventors: Anuraag Mohan, Fremont, CA (US); Phillip G. Mather, Phoenix, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 15/098,560

(22) Filed: Apr. 14, 2016

(65) Prior Publication Data

US 2016/0313413 A1    Oct. 27, 2016

Related U.S. Application Data

(60) Provisional application No. 62/153,066, filed on Apr. 27, 2015.

(51) Int. Cl.
*G01R 33/09* (2006.01)
*G01R 33/00* (2006.01)
*G01R 17/10* (2006.01)

(52) U.S. Cl.
CPC ........ *G01R 33/098* (2013.01); *G01R 33/0011* (2013.01); *G01R 33/093* (2013.01); *G01R 33/096* (2013.01); *G01R 17/10* (2013.01)

(58) Field of Classification Search
USPC ......... 324/252, 251, 207.2, 244, 117 R, 202, 324/207.21, 117 H, 207.12, 260, 207.13, 324/225, 228, 239, 750.3, 612, 613, 324/207.11, 246, 207.14, 207.24, 247, 324/258; 257/427, E29.323, 422, 421, 257/E27.005; 438/3; 338/32 H, 32 R; 428/611
See application file for complete search history.

(56) References Cited

U.S. PATENT DOCUMENTS

| | | | |
|---|---|---|---|
| 5,055,786 A | | 10/1991 | Wakatsuki et al. |
| 5,521,501 A | * | 5/1996 | Dettmann ............ G01R 33/096 324/207.12 |
| 5,920,446 A | * | 7/1999 | Gill ........................ B82Y 10/00 360/324 |
| 6,031,273 A | * | 2/2000 | Torok ..................... B82Y 10/00 257/421 |

(Continued)

OTHER PUBLICATIONS

International Search Report and Written Opinion issued in corresponding International Application No. PCT/US16/29107, mailed Aug. 5, 2016.

*Primary Examiner* — Melissa Koval
*Assistant Examiner* — Nasima Monsur
(74) *Attorney, Agent, or Firm* — Bookoff McAndrews, PLLC

(57) ABSTRACT

In one embodiment, a TMR field sensor utilizes existing one or more self-test current lines in a configuration to extend magnetic field measurement range without sacrificing measurement sensitivity. The self-test current lines are energized to facilitate magnetic field measurement when the measured magnetic field reaches a threshold. The magnetic field created by self-test coil opposes an external magnetic field being measured to keep the net magnetic field within a desired range where the magnetic field sensor has linear output and desired sensitivity.

22 Claims, 6 Drawing Sheets

(56) References Cited

U.S. PATENT DOCUMENTS

| | | | |
|---|---|---|---|
| 6,259,586 B1 * | 7/2001 | Gill | B82Y 10/00 360/314 |
| 6,430,012 B1 * | 8/2002 | Sano | B82Y 10/00 324/207.21 |
| 2004/0075152 A1 * | 4/2004 | Barna | G11C 11/15 257/421 |
| 2011/0169488 A1 | 7/2011 | Mather | |
| 2011/0244599 A1 | 10/2011 | Whig et al. | |
| 2013/0300402 A1 | 11/2013 | Liu et al. | |

* cited by examiner

X/Y AXIS CONFIGURATION

X/Y AXIS CONFIGURATION

Z AXIS CONFIGURATION

Z AXIS CONFIGURATION

MAGNETIC FIELD SENSOR WITH INCREASED FIELD RANGE

CROSS REFERENCE TO RELATED APPLICATIONS

This application claims the benefit of priority to U.S. Provisional Application No. 62/153,066, filed Apr. 27, 2015, the entire contents of which is herein incorporated by reference.

TECHNICAL FIELD

The present inventions relate generally to the field of magnetic field sensors and more particularly to methods of increasing field range of magnetic field sensors.

BACKGROUND OF THE INVENTION

Magnetic field sensors have been commonly used in various electronic devices, such as computers, laptops, media players, smart phones, etc. There are several techniques/devices that can be used for detecting a magnetic field. Tunneling Magnetoresistance (TMR) is a promising magnetic sensing technology for handset applications due to its advantages in sensitivity, power, and process cost compared with other magnetic sensors. Another closely related technology in magnetic field sensing is Giant Magnetoresistance (GMR).

A TMR element is composed of two ferromagnetic layers separated by a non-magnetic, insulating tunnel barrier. One layer has a magnetization direction that is "free" to rotate in a magnetic field. The other layer has a "fixed," reference magnetization that does not rotate when in a magnetic field of moderate to low strength that is of sensing interest. If the magnetization directions of the two layers are parallel to each other, the electrical resistance of the tunnel barrier is low. Conversely, when the magnetization directions are anti-parallel, the resistance is high. A magnetic field sensor based on TMR therefore converts magnetic field into electrical signal by a change in electrical resistance due to the changing angle of the magnetic free layer relative to the fixed layer in response to the field.

Typical magnetic sensors are restricted by the field range they can measure. Magnetic sensors have a sensitivity and measurement range built into the device by factors such as sense layer thickness, shape, and flux concentrator geometry. A magnetic sensor has good sensitivity and linear output corresponding to a certain magnetic field range. When the magnetic field is beyond the certain magnetic field range, the magnetic sensor may have nonlinear output and become less sensitive. On the other hand, a magnetic sensor with broader magnetic field measurement range may not have desired high sensitivity across the whole measurement range.

Therefore, it would be desirable to have a system, device, and method to effectively increase magnetic field measurement range of magnetic field sensors and maintain high measurement sensitivity.

SUMMARY OF THE INVENTION

Certain embodiments of the inventions provide for systems, devices, and methods to effectively increase magnetic field measurement range of a TMR magnetic field sensor and maintain high measurement sensitivity.

According to various embodiments of the inventions, a TMR magnetic field sensor utilizes existing one or more self-test current lines in a configuration to extend a magnetic field measurement range without sacrificing measurement sensitivity. The TMR field sensor comprises a first bridge circuit including a plurality of TMR elements configured to sense a magnetic field. Each TMR element comprises a first ferromagnetic layer (free layer) and a second ferromagnetic layer (fixed layer) separated by a non-magnetic, insulating tunnel barrier. The TMR field sensor further comprises one or more self-test current lines coupled to a self-test source to perform, e.g., in-situ characterization and calibration of the sensor. The self-test current lines may be routed to form a coil with multiple turns around the TMR elements.

In certain embodiments, the self-test current lines are energized to facilitate a magnetic field measurement when the magnitude of a measured magnetic field reaches a threshold. The magnetic field created by a self-test coil opposes the external magnetic field being measured in order to keep a net magnetic field within a desired range, where the magnetic field sensor has a linear output and a desired sensitivity. The output of the magnetic field sensor will be adjusted by the magnetic field created by the self-test coil, to allow for the calculation of an actual external magnetic field. The self-test current lines may be energized with a fixed current to provide a constant opposing magnetic field. The self-test current lines may also be energized with a varying current to provide a varying opposing magnetic field such that the magnetic field sensor has a fixed output.

In certain embodiments, the magnetic field sensor may further comprise a second circuit that comprises a plurality of built-in current lines placed adjacent to the second ferromagnetic layer (e.g., the fixed layer) of each TMR element of the first bridge circuit. The current lines are serially or sequentially connected to a field source, and a periodic bipolar current pulse is applied to all of the current lines to form a magnetic 1/f noise and an offset reduction within the TMR sensors. The periodic bipolar current pulse is applied only when the measured magnetic field (along one or more axes) is below a certain threshold. When the measured magnetic field is above the certain threshold, the built-in current lines are operated in a DC mode (i.e. without chopping). This allows for a low field high signal-to-noise ratio (SNR) operation, but avoids a possibility of over drive or inductive coupling to add noise at a output signal.

In certain embodiments, a magnetic field measurement circuit comprises a first type of magnetic field sensor and a second type of magnetic field sensor. The second type of magnetic field sensor may have a broader linear magnetic field range, but lower sensitivity than the first type of magnetic field sensor. The outputs of the first and second type sensors are coupled to a multiplexer, which normally engages the first type magnetic field sensor when a magnetic field is within the linear range of the first type of magnetic field sensor. When the first type of magnetic field sensor starts to enter a non-linear range, the multiplexer switches to engage the second type of magnetic field sensor.

While the present inventions are discussed below using TMR magnetic fields sensors having TMR elements, all aspects of the inventions will directly apply to devices based on giant magnetoresistance (GMR) technology as well. The inventions disclosed here also apply to any magnetic sensing technology that utilizes soft-magnetic films for sensing magnetic fields, such as, for example, anisotropic magnetoresistance (AMR), Fluxgate, and Hall sensors with a flux concentrator. For simplicity and clarity, the inventions will be described in more detail below using TMR technology as an example.

BRIEF DESCRIPTION OF THE DRAWINGS

Reference will be made to exemplary embodiments of the present inventions that are illustrated in the accompanying figures. Those figures are intended to be illustrative, rather than limiting. Although the present inventions are generally described in the context of those embodiments, it is not intended by so doing to limit the scope of the present inventions to the particular features of the embodiments depicted and described.

Figure 1:
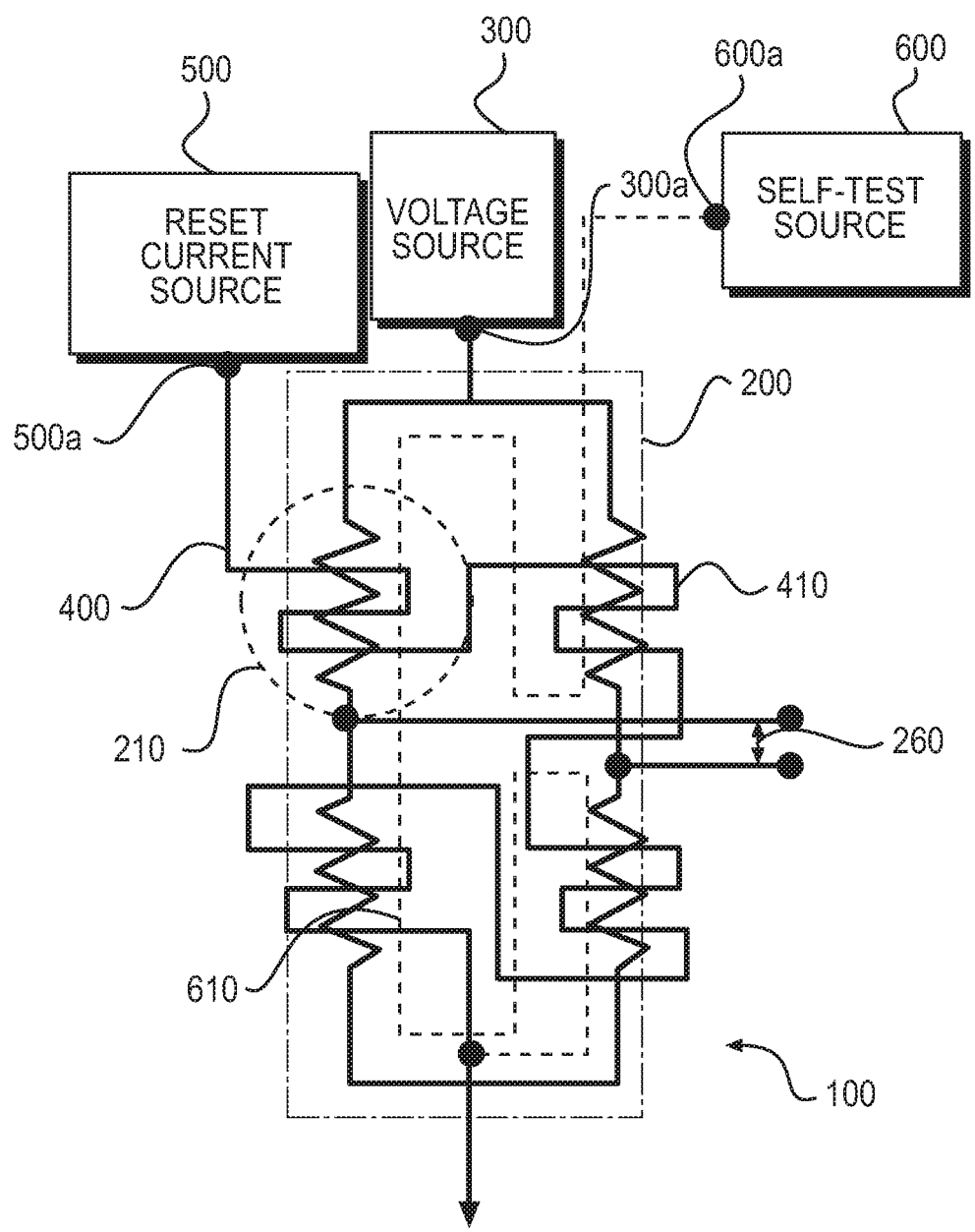
FIG. 1 is an exemplary structure overview of a TMR magnetic field sensor according to various embodiments of the inventions.

One skilled in the art will recognize that various implementations and embodiments of the inventions may be practiced in accordance with the specification. All of these implementations and embodiments are intended to be included within the scope of the inventions.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION OF THE PREFERRED EMBODIMENTS

In the following description, for the purpose of explanation, specific details are set forth in order to provide an understanding of the present inventions. The present inventions may, however, be practiced without some or all of these details. The embodiments of the present inventions described below may be incorporated into a number of different electrical components, circuits, devices, and systems. Structures and devices shown in block diagram are illustrative of exemplary embodiments of the present inventions and are not to be used as a pretext by which to obscure broad teachings of the present inventions. Connections between components within the figures are not intended to be limited to direct connections. Rather, connections between components may be modified, re-formatted, rerouted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present inventions. Thus, the appearance of the phrase, "in one embodiment," in different places in the specification does not constitute a plurality of references to a single embodiment of the present inventions.

Various embodiments of the inventions are used for systems, devices, and methods to effectively increase a magnetic field measurement range of a TMR magnetic field sensor and maintain desired measurement sensitivity. The TMR magnetic field sensors, and the one or more TMR elements therein, may be integrated on a single component or contain discrete components. Furthermore, embodiments of the inventions are applicable to a diverse set of techniques and methods.

As mentioned above, the magnetic field sensors as claimed herein may mean one or more of TMR magnetic fields sensors, GMR magnetic field sensors, AMR magnetic field sensors, Fluxgate magnetic field sensors, and/or Hall magnetic field sensors with a flux concentrator. Further, magnetoresistance sense elements as claimed herein may mean one or more of TMR elements, GMR elements, AMR elements, Fluxgate elements, and/or Hall elements with flux concentrators.

FIG. 1 shows a schematic diagram of a TMR magnetic field sensor 100, according to various embodiments of the inventions. The magnetic field sensor 100 comprises a first bridge circuit 200 powered by a voltage source 300 connected via a voltage source connection 300a, and a second circuit 400 powered by an optional reset field source 500, which may be a current source, connected via a reset field source connection 500a. The first bridge circuit 200 comprises a plurality of TMR elements 210. The bridge circuit 200 may be a half bridge circuit, a full bridge circuit, or any combinations thereof. In one embodiment, the bridge circuit 200 is a bridge circuit having two circuit branches with a bridge output signal 260 between the two branches at some intermediate point along the branches.

The magnetic field sensor 100 also comprises a plurality of self-test current lines 610 forming a self-test circuit powered by a self-test source 600, which may be a current source, connected via a self-test source connection 600a. Each TMR elements 210 has at least one corresponding built-in current line coupled to the reset field source 500, via the reset field source connection 500a, and at least one corresponding built-in self-test current line 610 coupled to the self-test source 600 via the self-test source connection 600a.

Figure 2:
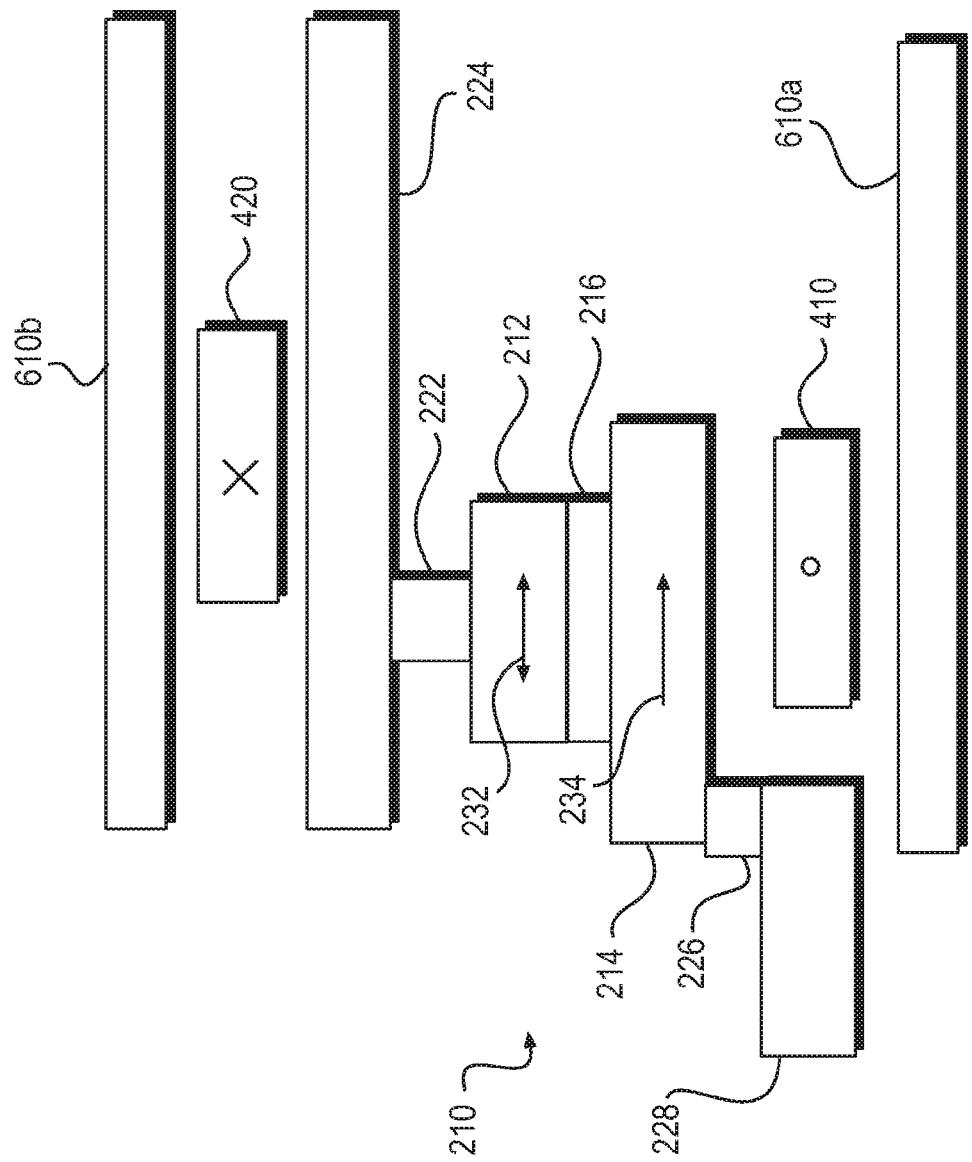
FIG. 2 is a cross-section view of a single TMR element according to various embodiments of the inventions.

The self-test circuit is typically used for a calibration of sensitivity and a measure of functionality. When measurements at different self-test currents are combined with measurements at different reset current values, it becomes possible to extract the intrinsic sensor electrical offset for a more accurate external magnetic field measurement FIG. 2 illustrates a cross-section view of a single TMR element 210, according to various embodiments of the inventions. The TMR sensor 210 is composed of a first ferromagnetic layer 212 and a second ferromagnetic layer 214 separated by a non-magnetic, insulating tunnel barrier 216. In one embodiment, the first layer 212 has a magnetization direction 232 that is free to rotate in a magnetic field. The second layer 214 has a fixed reference magnetization direction 234 that does not rotate when in a magnetic field. If the magnetization directions of the two layers are parallel to each other, the electrical resistance of the tunnel barrier 216 is relatively low. Conversely, when the magnetization directions are antiparallel, the resistance is relatively higher.

The TMR element 210 therefore converts a magnetic field into an electrical signal by changing the electrical resistance due to a changing angle of the magnetization direction 232 of the magnetic free layer relative to the reference magnetization direction 234 of the fixed layer in response to the field. The ferromagnetic layers 212 and 214 may be formed from any suitable ferromagnetic material, such as Ni, Fe, Co, or their alloys. The insulating tunnel barrier 216 may be composed of insulator materials such as AlOx, MgOx, ZrOx, TiOx, HfOx, or any combinations thereof.

In one embodiment, the first ferromagnetic layer 212 is connected to a first conductive line 224 by a first contact 222, and the second ferromagnetic layer 214 is connected to a second conductive line 228 by a second contact 226, which may contact from above as well as below the second ferromagnetic layer 214.

In one embodiment, the second circuit 400 comprises a plurality of built-in current lines 410 located adjacent to the second ferromagnetic layer 214 of each TMR element 210. The current lines 410 are connected such that a current pulse is applied to the current line for each TMR element 210. The connection of the current lines 410 may be sequential, serial, or time multiplexed, according to various embodiments. In another embodiment, the second circuit 400 may also comprise a second plurality of built-in current lines 420 located adjacent to the first ferromagnetic layer 212. The first ferromagnetic layer 212 is patterned into a shape that has a long axis and a short axis. In a zero magnetic field, the magnetization direction of the first ferromagnetic layer 212 lies along the long axis of the element 210, and can be directed in either of the two directions along this axis. By applying a control current signal to the current line 410 and/or the current line 420, an induced magnetic field is generated in an ambient area surrounding the current line. Since the first layer 212 has a magnetization direction 232 that is free to rotate and switch, the magnetization direction 232 will switch to along the direction projected on its axis by the induced magnetic field.

As an exemplary illustration in FIG. 2, when the current in the current line 410 has a direction pointing outward and the current in the current line 420 has a direction pointing inward, the magnetization direction 232 points leftward, which is has a component that is negatively aligned to the reference magnetization direction 234, and will switch the magnetization direction 232 of the free layer to the left; when the current in the current line 410 has a direction pointing inward and/or the current in the built-in current line 420 has a direction pointing outward, the magnetization direction 232 points rightward, which has a component that is positively aligned to the reference magnetization direction 234, and will switch the magnetization direction 232 of the free layer to the right.

In one embodiment, a self-test circuit may include one or more self-test current lines 610 located adjacent to the TMR element 210. For example, current line 610a is deposited below the built-in current line 410 and a self-test line 610b is deposited above the built-in current line 420. The self-test lines 610a and 610b are metal conductors that generate a magnetic field when a current is passed through. The self-test current lines 610a and 610b may be routed in various ways. For example, the self-test current lines 610a and 610b may be routed together to form a self-test loop around the TMR element 210. The magnetic field generated by the self-test loop is aligned with an axis of the external magnetic field direction. For example, the magnetic field generated by the self-test loop of an X-axis magnetic sensor is either positively or negatively aligned to the X-axis.

Figure 3A:
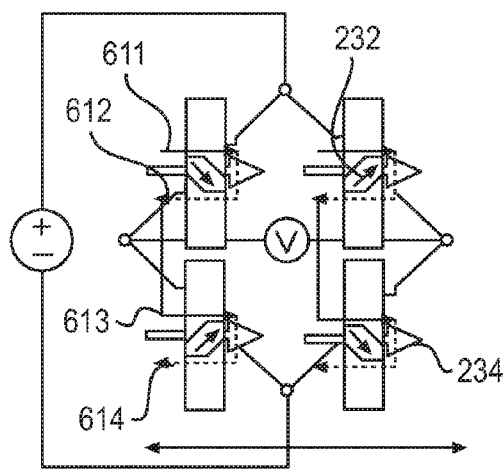
FIGS. 3A-3B depict exemplary diagrams of bridge circuits for measurement of X- or Y-axes of a magnetic field, with self-test current lines according to various embodiments of the inventions.
Figure 3B:
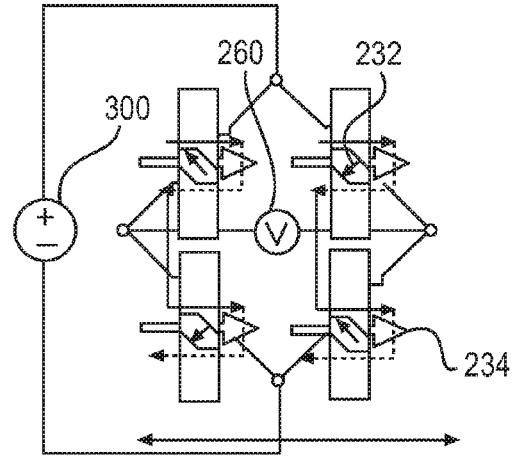

FIGS. 3A and 3B illustrate exemplary diagrams of bridge circuits for measurement of X- or Y-axes of a magnetic field, with self-test current lines, according to various embodiments of the inventions. When a current pulse is applied to the current line 410, a magnetic field pulse with a magnetization direction 232 is generated on the first ferromagnetic layer. Depending on the polarity of the applied current pulse, the generated magnetic field switches the free layer direction 232 to have a component that is positively or negatively aligned to the reference magnetization direction 234 of the second ferromagnetic layer. FIG. 3A shows a generally positively aligned magnetization direction 232 in the first ferromagnetic layer 212, and FIG. 3B shows a generally negatively aligned magnetization direction 232 in the first ferromagnetic layer 212.

The self-test current lines 611, 612, 613, and 614 are routed together to form a multiple-turn self-test current loop around the bridge circuit. The self-test current lines 611 and 613 (solid lines) are disposed or deposited above the first ferromagnetic layer 212, and the self-test current lines 612 and 614 (dashed lines) are disposed or deposited beneath the second ferromagnetic layer 214. The multiple-turn self-test current loop generates a magnetic field along X- or Y-axes (for a X- or Y- axis magnetic sensor). Besides the routing way shown in FIGS. 3A and 3B, the self-test current lines 611, 612, 613, and 614 may be routed in other patterns. For example, the self-test current lines 611 and 613 (solid lines) disposed or deposited above the first ferromagnetic layer 212 may be connected together. The self-test current lines 612 and 614 (dashed lines) disposed or deposited below the second ferromagnetic layer 214 may be connected together.

Figure 4A:
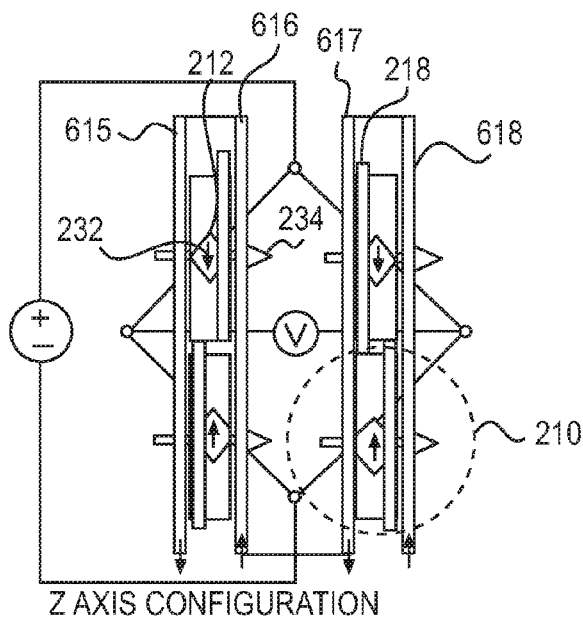
FIGS. 4A-4B depict exemplary diagrams of bridge circuits for measurement of a Z-axis of a magnetic field, with self-test current lines according to various embodiments of the inventions.
Figure 4B:
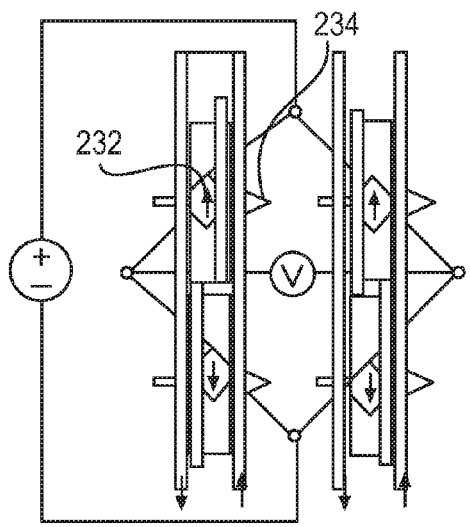

FIGS. 4A and 4B illustrate exemplary diagrams of two different chopping states of a bridge circuit for Z-axis magnetic sensing according to various embodiments of the inventions. For Z-axis magnetic sensing, each TMR element 210 integrates at least one flux guide 218. The flux guide 218 is a high aspect ratio vertical bar made from a high permeability magnetic material with ends terminating in close proximity to opposed edges of the TMR element, in each respective bridge leg. In one embodiment, the flux guide may be displaced or disposed above and/or below the first (free) ferromagnetic layer 212. The flux guide captures magnetic flux from an applied field oriented in the Z direction, and bends the field lines to have a horizontal component near the ends of the flux guides. FIG. 4A shows a +90 degree cross angle between the generated magnetization direction 232 and the reference magnetization direction 234, and FIG. 4B shows a −90 degree cross angle.

A single TMR element 210 for Z-axis magnetic measurement may also comprise self-test current lines (such as self-test current lines 615, 616, 617, and/or 618) on one or both sides of the flux guide 218. The self-test lines 615 and 616 (also applicable to self-test current lines 617 and 618) are formed parallel to the flux guides 218, and preferably equidistant from the first ferromagnetic layer 212. The self-test lines 615-618 are a conductive material, for example, copper (Cu) or aluminum (Al). While the self-test lines 615-618 are illustrated as four lines, it is understood they could be one integrated line, or another sub-grouping of series and parallel routed lines for optimal power and voltage requirements as dictated by the device. Also, as the self-test lines 615 and 616 are equidistant from the first ferromagnetic layer 212, the lateral (X or Y) components of the generated magnetic fields at the first ferromagnetic layer 212 are of equal value and with opposite directions, therefore netting zero at the sense element center. The self-test current lines 615, 616, 617, and 618 generate a magnetic field along Z-axis.

As illustrated in FIGS. 4A and 4B, the self-test current lines 615, 616, 617 and 618 are routed together to form a multiple-path self-test current loop near the bridge circuit. Besides the routing way shown in FIGS. 4A and 4B, the self-test current lines 615, 616, 617, and 618 may be routed in other patterns. For example, the self-test current lines 615 and 617 (with the same current direction) may be connected together, and the self-test current lines 616 and 618 may be connected together.

Figure 5A:
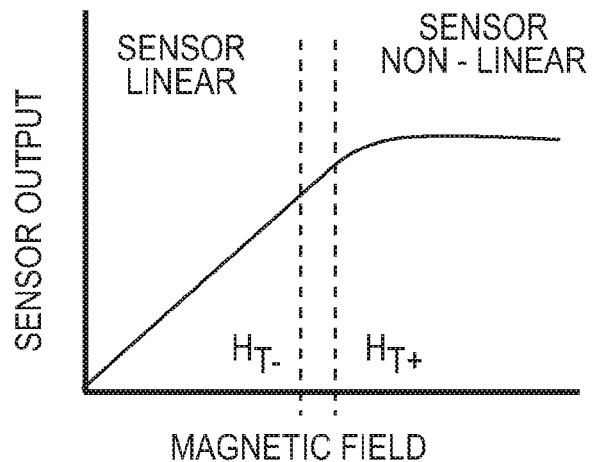
FIGS. 5A and 5B depict exemplary diagrams of magnetic field sensor output related to an external magnetic field according to various embodiments of the inventions.
Figure 5B:
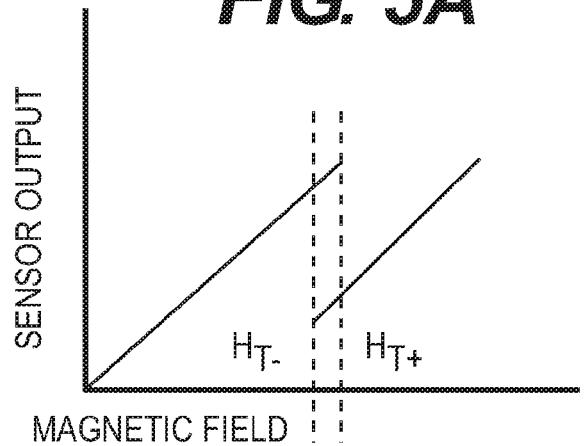
Figure 5C:
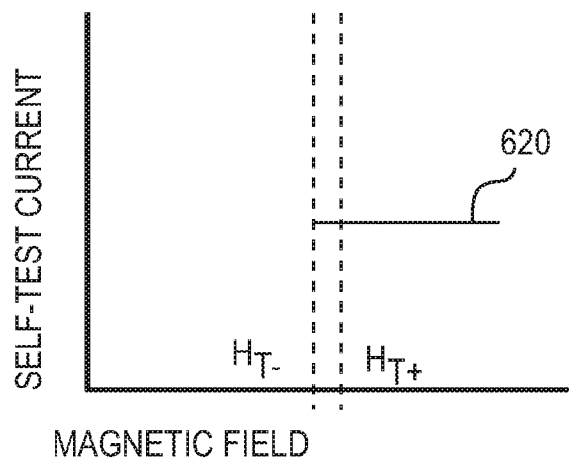
FIG. 5C depicts an exemplary diagram of an application of a self-test current according to various embodiments of the inventions.

FIGS. 5A and 5B depict exemplary diagrams of magnetic field sensor output related to an external magnetic field, and FIG. 5C depicts the application of an exemplary self-test current according to various embodiments of the inventions. FIG. 5A is a typical magnetic field sensor output at an external magnetic field.

FIG. 5B is another magnetic field sensor output at an external magnetic field with the self-test current line energized. FIG. 5C shows the current in the self-test current line(s) for the magnetic field sensor to have output identified in FIG. 5B. The self-test current line(s) is/are energized with a fixed current 620 when the external magnetic field reaches the first threshold $H_{T+}$ (or when the magnetic field sensor has an output corresponding to the first threshold $H_{T+}$). The magnetic field created by the self-test line(s) or self-test coil (as shown in FIGS. 3A, 3B, 4A, and 4B) oppose(s) the external magnetic field to keep the net magnetic field within a desired range (below $H_{T+}$) where the magnetic field sensor has linear output and desired sensitivity. The output of the magnetic field sensor will be adjusted by the magnetic field created by self-test coil for the calculation of the actual external magnetic field. In order to prevent an unstable system where small field fluctuations around the switching point $H_{T+}$ can cause rapid switching back and forth between operating modes, it is useful to build hysteresis into the control circuit. In such a case, when the external magnetic field drops below a second threshold $H_{T-}$ (smaller than the first threshold $H_{T+}$), the self-test current line(s) is/are de-energized and the magnetic field sensor returns back to the linear function region again. While a single threshold $H_{T+}$ and a single threshold $H_{T-}$ are illustrated in FIGS. 5A, 5B, and 5C, it is understood that the threshold $H_{T+}$ and threshold $H_{T-}$ for X-, Y-, or Z-axes may or may not be the same. Moreover, the threshold $H_{T+}$ and threshold $H_{T-}$ for X-, Y-, and/or Z-axes may be a variable value instead of a fixed value. The threshold $H_{T+}$ and threshold $H_{T-}$ of one axis may be influenced by factors, such as the actual magnetic field on other axes, the current applied on the current line within the sense element, ambient temperature, etc. In one embodiment, the first threshold $H_{T+}$ and the second threshold $H_{T-}$ are separated by at least 1 to 2 Gauss, such that for the magnetic sensor application in a cell phone, an extended axis will not switch between two sensor output modes during normal use.

Figure 6A:
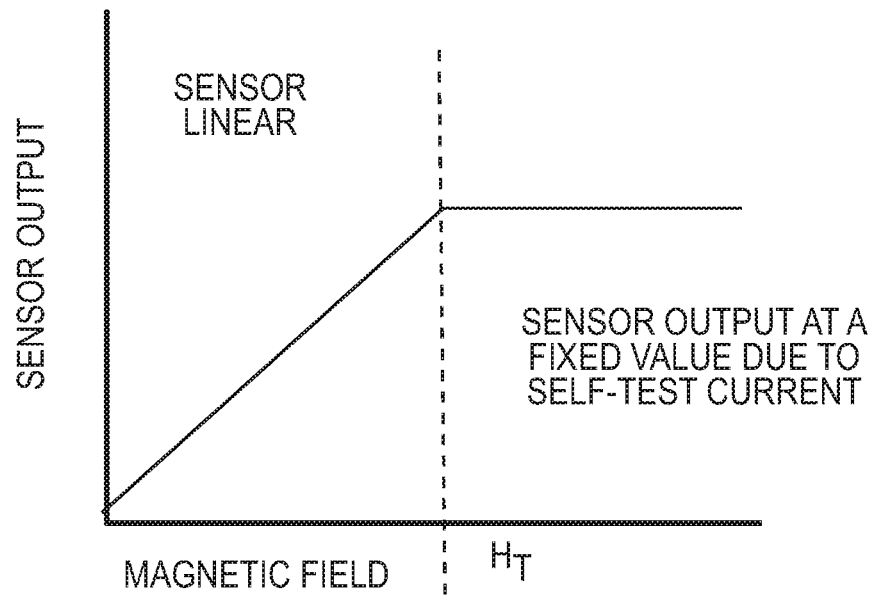
FIG. 6A depicts another exemplary diagram of magnetic field sensor output related to an external magnetic field according to various embodiments of the inventions.
Figure 6B:
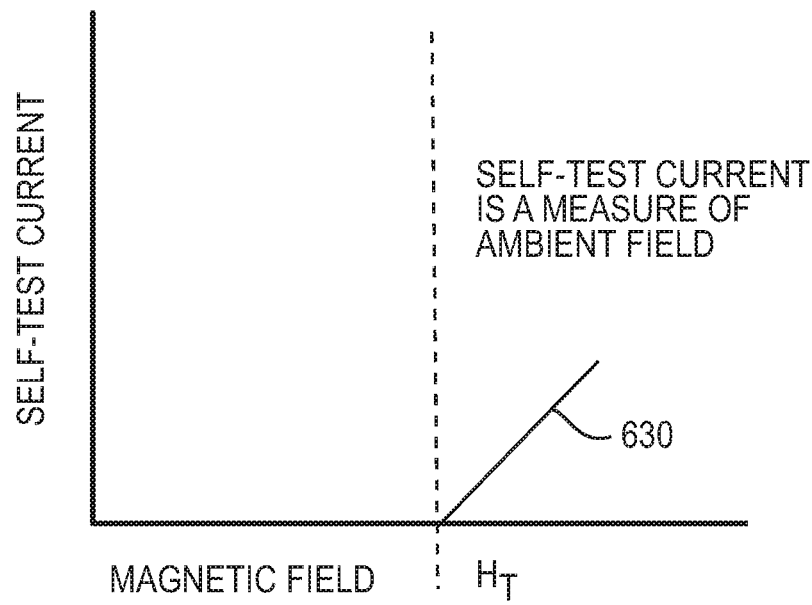
FIG. 6B depicts another exemplary diagram of an application of a self-test current according to various embodiments of the inventions.

FIG. 6A depicts another exemplary diagram of magnetic field sensor output related to an external magnetic field, and FIG. 6B depicts the application of another exemplary self-test current according to various embodiments of the inventions. The self-test current line(s) is/are energized when the external magnetic field reaches the threshold $H_T$ (or when the magnetic field sensor has an output corresponding to the threshold $H_T$). Compared to FIGS. 5B and 5C, the self-test current lines are energized with a varying current 630 to provide a varying opposing magnetic field such that the magnetic field sensor has a fixed output. The actual external magnetic field will be obtained by adding the fixed output from the magnetic field sensor with the varying opposing magnetic field.

In certain embodiments, a periodic bipolar current pulse is applied to all of the built-in current lines 410 and/or 420 for magnetic 1/f noise and offset reduction within the TMR magnetic field sensor. The periodic bipolar current pulse is applied only when the measured magnetic field (along one or more axes) is below the threshold $H_T$. When the external magnetic field is above the threshold, the built-in current lines are operated in a DC mode (i.e., without bipolar chopping). This allows low field high signal-to-noise ratio (SNR) operation, but avoids possibility of over drive or inductive coupling to add noise at the output signal. The method and techniques of applying a bipolar current adjacent to each TMR element are described in U.S. patent application Ser. No. 14/495,753, filed on Sep. 24, 2014, published as U.S. Patent Application Publication No. 2015/0331065 A1, which is hereby incorporated by reference in its entirety. The current lines 410 and/or 420 may be serially or sequentially connected to the reset current source 500 via the reset current source connection 500a to receive the bipolar current pulse for 1/f noise reduction in the field sensor.

Figure 7A:
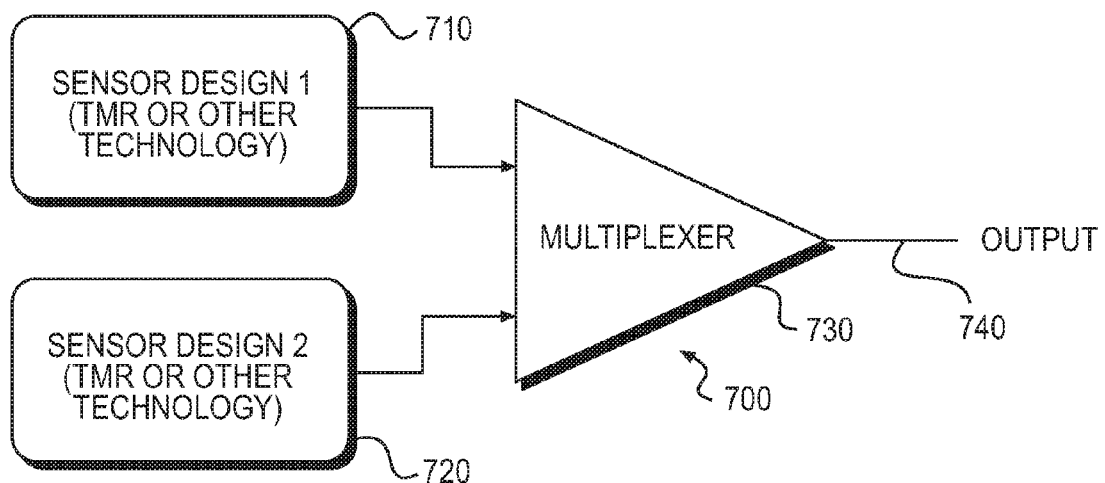
FIG. 7A depicts an exemplary diagram of a magnetic field measurement circuit with multiple types of magnetic field sensor designs according to various embodiments of the inventions.
Figure 7B:
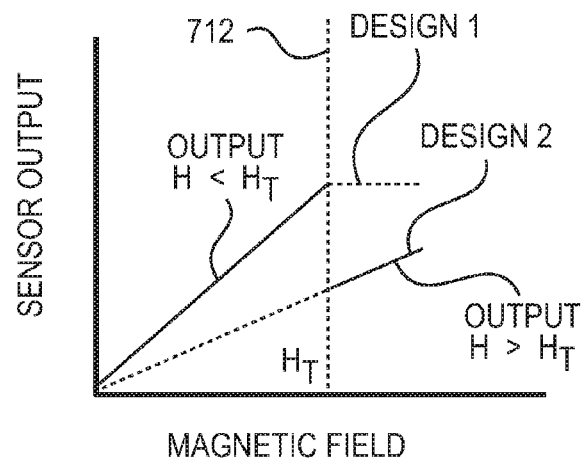
FIGS. 7B is an exemplary diagram of magnetic field sensor output related to an external magnetic field according to various embodiments of the inventions.

FIGS. 7A and 7B depict exemplary diagrams of a magnetic field measurement circuit with multiple types of sensor design according to various embodiments of the inventions. The magnetic field measurement circuit 700 comprises a first type magnetic field sensor 710 and a second type magnetic field sensor 720. The second type magnetic field sensor 720 has broader linear magnetic field range but lower sensitivity than the first type magnetic field sensor 710. The outputs of the first and second type sensors 710 and 720 couple to a multiplexer 730 for a final output 740. When the external magnetic field is within the linear magnetic field range (below the threshold of $H_T$ 712) of first type magnetic field sensor 710, the multiplexer 730 engages the first type magnetic field sensor 710. When the first type sensor 710 starts to enter a non-linear range, the multiplexer 730 engages the second type magnetic field sensor 720 instead, such that the final output 740 still has a linear relation to the external magnetic field. The final output 740 is processed properly for the actual external magnetic field.

While only two different types of magnetic field sensor are illustrated in FIGS. 7A and 7B, it is understood that more than two different types of magnetic field sensors may be utilized in a similar way and such variations are still within the scope of this inventions.

In one embodiment, the first and second type sensors are the same type sensors but with different specifications. In another embodiment, the first type and second type sensors are different types. For example, the first type sensor may be a TMR sensor and the second type sensor may be a GMR, AMR, Hall, Fluxgate sensor, etc. One preferred embodiment herein would be using a TMR sensor as a first type sensor and a Hall sensor as a second type sensor, as a Hall sensor needs higher power but also has a larger measurement range. Moreover, a Hall sensor can be easily added to a typical silicon process with a TMR sensor on the same die, Such arrangement would be able to cover a wide magnetic field range, but relatively higher power cost only at the relatively high magnetic field.

One skilled in the art will recognize that various implementations may be realized within the described architecture, all of which fall within the scope of the inventions. For example, various self-test current energizing methods may be implemented to counter-balance the magnetic field being measured in TMR magnetic field sensors. The self-test current energizing methods may not be limited to the aforementioned fixed current method or the linear current method.

The foregoing description of the inventions has been described for purposes of clarity and understanding. It is not intended to limit the inventions to the precise form disclosed. Various modifications may be possible within the scope and equivalence of the application.

What is claimed is:

1. A magnetic field sensor, comprising:
    a plurality of magnetoresistance sense elements coupled together as a first circuit to sense a magnetic field, wherein the first circuit is configured to produce a linear output when the first circuit senses a magnetic field having a magnitude less than a first sense threshold of the magnetic field sensor, wherein each magnetoresistance sense element comprises:
      a reference layer,
      a sense layer, and
      an intermediate layer between the reference layer and the sense layer;
    and
    a second circuit comprising a first plurality of current lines, wherein each current line of the first plurality of current lines is adjacent to a corresponding magnetoresistance sense element of the plurality of magnetoresistance sense elements, wherein, when energized, at least one current line of the first plurality of current lines is configured to generate a second magnetic field opposing the magnetic field sensed by the first circuit, and wherein, in the presence of the second magnetic field, the magnetic field sensor is configured to produce a linear output when the first circuit senses a magnetic field having a magnitude greater than the first sense threshold of magnetic field sensor.

2. The magnetic field sensor of claim 1, wherein the at least one current line is energized with a fixed current.

3. The magnetic field sensor of claim 2, wherein the second magnetic field is a constant magnetic field.

4. The magnetic field sensor of claim 1, wherein the first circuit includes a hysteresis control.

5. The magnetic field sensor of claim 1, wherein the at least one current line is energized with a variable current.

6. The magnetic field sensor of claim 1, wherein the intermediate layer is a non-magnetic, insulating barrier.

7. The magnetic field sensor of claim 1, wherein the sense layer of each magnetoresistance sense element includes a magnetization direction free to rotate in a magnetic field, and wherein the reference layer of each magnetoresistance sense element includes a fixed magnetization direction.

8. The magnetic field sensor of claim 1, wherein the plurality of magnetoresistance sense elements includes one or more tunneling magnetoresistance sense elements and giant magnetoresistance sense elements.

9. The magnetic field sensor of claim 1, wherein one or more current lines of the first plurality of current lines are routed to form a loop around at least one magnetoresistance sense element of the plurality of magnetoresistance sense elements.

10. The magnetic field sensor of claim 9, wherein at least one current line of the first plurality of current lines is positioned below a magnetoresistance sense element.

11. The magnetic field sensor of claim 9, wherein at least one current line of the first plurality of current lines is positioned above a magnetoresistance sense element.

12. The magnetic field sensor of claim 1, further comprising:
    a third circuit comprising a second plurality of current lines, wherein each current line of the second plurality of current lines is adjacent to a corresponding magnetoresistance sense element of the plurality of magnetoresistance sense elements,
    wherein the third circuit is configured to apply a bipolar current signal adjacent to each of the plurality of magnetoresistance sense elements, and wherein the bipolar current signal enables cancellation of at least a portion of 1/f noise generated from at least one of the magnetoresistance sense elements of the plurality of magnetoresistance sense elements.

13. The magnetic field sensor of claim 12, wherein at least one current line of the second plurality of current lines is positioned below a current line of the first plurality of current lines.

14. The magnetic field sensor of claim 12, wherein at least one current line of the second plurality of current lines is positioned above a current line of the first plurality of current lines.

15. The magnetic field sensor of claim 1, wherein at least one magnetoresistance sense element of the plurality of magnetoresistance sense elements includes at least one flux guide.

16. The magnetic field sensor of claim 15, wherein the at least one flux guide is a high aspect ratio vertical bar comprising a high permeability magnetic material with an end terminating proximate to an edge of the respective magnetoresistance sense element.

17. The magnetic field sensor of claim 15, wherein the at least one flux guide is positioned above the respective magnetoresistance sense element.

18. The magnetic field sensor of claim 15, wherein the at least one flux guide is positioned below the respective magnetoresistance sense element.

19. The magnetic field sensor of claim 1, wherein the first circuit is a half bridge circuit or a full bridge circuit.

20. A magnetic field sensor, comprising:
    a plurality of magnetoresistance sense elements coupled together as a first circuit to sense a magnetic field, wherein the first circuit is configured to produce a linear output when the first circuit senses a magnetic field having a magnitude less than a first sense threshold of the magnetic field sensor; and
    a second circuit comprising a first plurality of current lines, wherein at least one current line of the first plurality of current lines is above a corresponding magnetoresistance sense element of the plurality of magnetoresistance sense elements, and at least one other current line of the first plurality of current lines is below the corresponding magnetoresistance sense element, wherein, when energized, the at least one current line is configured to generate a second magnetic field opposing the magnetic field sensed by the first circuit, and wherein, in the presence of the second magnetic field, the magnetic field sensor is configured to produce a linear output when the first circuit senses a magnetic field having a magnitude greater than the first sense threshold of magnetic field sensor.

21. The magnetic field sensor of claim 20, wherein each magnetoresistance sense element of the plurality of magnetoresistance sense elements comprises:
    a first ferromagnetic layer;
    a second ferromagnetic layer; and
    an intermediate layer disposed between the first and second ferromagnetic layers.

22. The magnetic field sensor of claim 20, wherein the plurality of magnetoresistance sense elements includes one or more tunneling magnetoresistance sense elements, giant magnetoresistance sense elements, and/or anisotropic magnetoresistance sense elements.

* * * * *